United States Patent [19]

Mizuno et al.

[11] Patent Number: 5,770,883
[45] Date of Patent: Jun. 23, 1998

[54] SEMICONDUCTOR SENSOR WITH A BUILT-IN AMPLIFICATION CIRCUIT

[75] Inventors: Koki Mizuno, Okazaki; Hiroshi Okada, Nukata-gun; Inao Toyoda, Okazaki; Masakazu Kanosue, Nagoya; Yasutoshi Suzuki, Okazaki; Kenichi Yokoyama, Nagoya, all of Japan

[73] Assignee: Nippondenso Co., Ltd., Kariya, Japan

[21] Appl. No.: 715,731

[22] Filed: Sep. 19, 1996

[30] Foreign Application Priority Data

Sep. 19, 1995 [JP] Japan .................................. 7-239933
Sep. 19, 1995 [JP] Japan .................................. 7-239937

[51] Int. Cl.⁶ .................................................. H01L 29/82
[52] U.S. Cl. .......................... 257/417; 257/418; 257/420
[58] Field of Search .................................... 257/417, 418, 257/420, 254, 619; 437/31, 34, 59, 41, 61, 63, 64, 48; 73/514.16, 514.36, 514.37, 514.38, 514.29, 505, 510, 514.32

[56] References Cited

U.S. PATENT DOCUMENTS

| | | | |
|---|---|---|---|
| 3,887,937 | 6/1975 | Gatos et al. | 257/417 |
| 4,736,089 | 4/1988 | Hair et al. | 257/417 |
| 4,921,811 | 5/1990 | Watanabe et al. | 437/31 |
| 5,461,916 | 10/1995 | Fujii et al. | 73/514.32 |
| 5,541,437 | 7/1996 | Watanabe et al. | 257/418 |
| 5,578,843 | 11/1996 | Garabedian et al. | 257/254 |
| 5,635,739 | 6/1997 | Grieff et al. | 257/254 |

FOREIGN PATENT DOCUMENTS

| | | |
|---|---|---|
| 60-41252 | 3/1985 | Japan . |
| 1-173846 | 7/1989 | Japan . |
| 4-280476 | 10/1992 | Japan . |
| 4-365302 | 12/1992 | Japan . |
| 5-126662 | 5/1993 | Japan . |
| 6-129926 | 5/1994 | Japan . |

*Primary Examiner*—Carl W. Whitehead
*Attorney, Agent, or Firm*—Cushman, Darby & Cushman IP Group of Pillsbury Madison & Sutro LLP

[57] ABSTRACT

A pair of signal voltages outputted from a bridge circuit composed of plural strain gauges are linearly amplified individually by a pair of amplifiers, whereupon a difference between the pair of signal voltages is detected. The pair of amplifiers are formed respectively in regions that are symmetrical with each other on a chip. As a result, variations in the output characteristics between the amplifiers are decreased.

13 Claims, 15 Drawing Sheets

SEMICONDUCTOR SENSOR WITH A BUILT-IN AMPLIFICATION CIRCUIT

CROSS REFERENCE TO RELATED APPLICATION

This application is based upon and claims the benefit of priority of the prior Japanese Patent Applications Nos. 7-239933 and 7-239937, the contents of which are incorporated herein by reference.

BACKGROUND OF THE INVENTION

1. Field of the Invention

The present invention relates to a semiconductor sensor with a built-in circuit such as an amplification circuit. More particularly, the invention concerns the decrease in the variations in the output characteristics thereof.

2. Related Arts

In conventional semiconductor strain sensors that are used in detection of, for example, a pressure or acceleration, a built-in amplification circuit type semiconductor sensor having signal amplification portions integrated on a chip has been put to practical application. To explain a semiconductor pressure sensor as an example, four strain-gauge (diffusion) resistors that have been formed in a diaphragm portion at the center of the chip are bridge connected to constitute a signal conversion portion. The signal voltages that are outputted individually from a pair of output terminals thereof respectively are then linearly amplified by signal amplification portions, i.e., sense amplifiers. Thereafter, the difference voltage between the amplified signal voltages is formed by a subtraction portion, and this difference voltage is outputted. As the signal amplification portions, in many cases, operational-amplifier type linear amplification circuits are generally used.

Also, in this type of sensor, the decrease in the DC offset and the decrease in the variation in the detection sensitivity are the basic problems to be solved. For this reason, trimming resistors are usually made beforehand to be built in the signal conversion portion, to thereby achieve such decrease by adjusting the resistance of the trimming resistors. Although, as a principle, it is possible to dice chips from the wafer and perform this adjustment in units of a chip, from the standpoint of the productivity, this adjustment is done actually in units of a wafer by irradiating a scanning laser onto the trimming resistors in each chip area or applying a high voltage prior to dicing into the chips.

However, there was the troublesome problem that even when the DC offset and the variation in the detection sensitivity were decreased on the wafer by adjusting the trimming resistors as mentioned above, by thereafter fixing the diced chip and the pedestal bonded thereto into a package the amounts of fluctuations in the DC offset voltage and detection sensitivity are (hereinafter referred to as "output characteristic") increased.

SUMMARY OF THE INVENTION

The inventors of the present invention have performed various experiments and, as a result, have discovered that the main causes of the fluctuations in the output characteristics that occur in steps that succeed the above-mentioned dicing step are the following inconveniences that occur in various steps that are executed between the formation of strain gauges on the semiconductor wafer and the succeeding trimming. The inconveniences including, for example, damages caused to the wafer by plasma particles in a step for the formation of a diaphragm or bendable beam that is made by etching performed from the rear surface of the wafer, thermal effects in a step for performing anodic bond of the wafer to the pedestal having a thermal expansion coefficient different from that of the wafer and damages caused to the rear surface portion such as the diaphragm by X rays or ultraviolet rays in a step for adhering a metallization layer onto the soldering surface of the pedestal by vacuum deposition or sputtering.

The above-mentioned thermal effects are more specifically explained. Since the wafer and pedestal that have been bonded together at a high temperature in the above-mentioned anodic bond step have different thermal expansion coefficients, in a succeeding state of operation at a normal temperature, residual stress occurs between the them and the residual stress affects the characteristics of the signal amplification portion through the wafer. Also, since a plurality of insulation films and metal wirings having thermal expansion coefficients different from each other are disposed on the integrated circuit region that constitutes the signal amplification portion on the chip, after completion of the anodic bond step, residual stress occurs in the integrated circuit region that constitutes the signal amplification portion. These residual stresses are eased by being released due to the heat in the above-mentioned packaging step. The degree by which these stresses are eased varies every chip, with the result that the output characteristics fluctuate. Also, it is also considered that residual stresses are newly caused to occur in the signal amplification portion for the same reason as mentioned above due to the heat (soldering) in the packaging step.

Next, damages caused to the wafer by plasma particles in the step for the formation of the diaphragm or bendable beam that is made by etching performed from the rear surface of the wafer are explained. In the case of performing such a deep etching treatment, masking is usually done with respect to a non-etched region of the rear surface of the wafer by using a nitride film. In order to perform cleaning of the rear surface of the wafer before depositing of this nitride film or perform formation of an opening in the nitride film or removal thereof, plasma cleaning or plasma etching is performed. When at this time plasma particles act on the transistors or gauge resistors on the surface portion of the wafer, the characteristics thereof vary, with the result that the characteristics of the strain sensor inconveniently vary.

Next, damages that are caused in the step for adhering the metallization layer onto the soldering surface of the pedestal by vacuum deposition or sputtering are explained. When such a metallization layer is formed by vacuum deposition, soft X-rays that are generated when electron beams are irradiated onto the evaporation material damage the semiconductor crystal at, for example, a rear surface of the thin diaphragm. This problem similarly arises also when sputtering is performed. Namely, damages occur in the semiconductor crystal at, for example, the diaphragm, with the result that the characteristics of the strain gauges vary inconveniently.

The present invention has been made in view of the above-mentioned problems, and an object of the present invention is to provide a semiconductor sensor which is small in the variations of the output characteristics.

In order to attain the above object, the first aspect of the present invention is drawn to a semiconductor sensor which comprises a semiconductor chip having integrated thereon a signal conversion portion for outputting a pair of signal voltages the difference between which corresponds to a physical quantity, a pair of signal amplification portions for amplifying the signal voltages individually, and a subtraction portion for outputting a difference voltage between the amplified signal voltages outputted from the signal amplification portions. According to the first aspect of the present invention, the signal amplification portions are disposed in symmetrical positions on the chip.

On the other hand, the second aspect of the present invention is drawn to a process for manufacturing a semiconductor sensor, which comprises the steps of: forming a signal conversion element and an adjusting resistance element on a wafer; bonding the wafer to a pedestal in a high temperature atmosphere and trimming the adjusting resistance element to thereby decrease the variations in the output characteristics of the signal conversion element. The process of the present invention also includes assembling the chip-equipped pedestal that has been obtained by dicing the wafer and pedestal onto a stem while the chip-equipped pedestal is being heated, and, the manufacturing process according to the second aspect of the present invention is characterized by an annealing step for heating the wafer and pedestal performed between the bonding step and the subsequent trimming step.

BRIEF DESCRIPTION OF THE DRAWINGS

These and other objects, features and characteristics of the present invention will be appreciated from a study of the following detailed description, the appended claims, and drawings, all of which form a part of this application. In the drawings:

DETAILED DESCRIPTION OF THE PRESENTLY PREFERRED EXEMPLARY EMBODIMENTS

Figure 1:
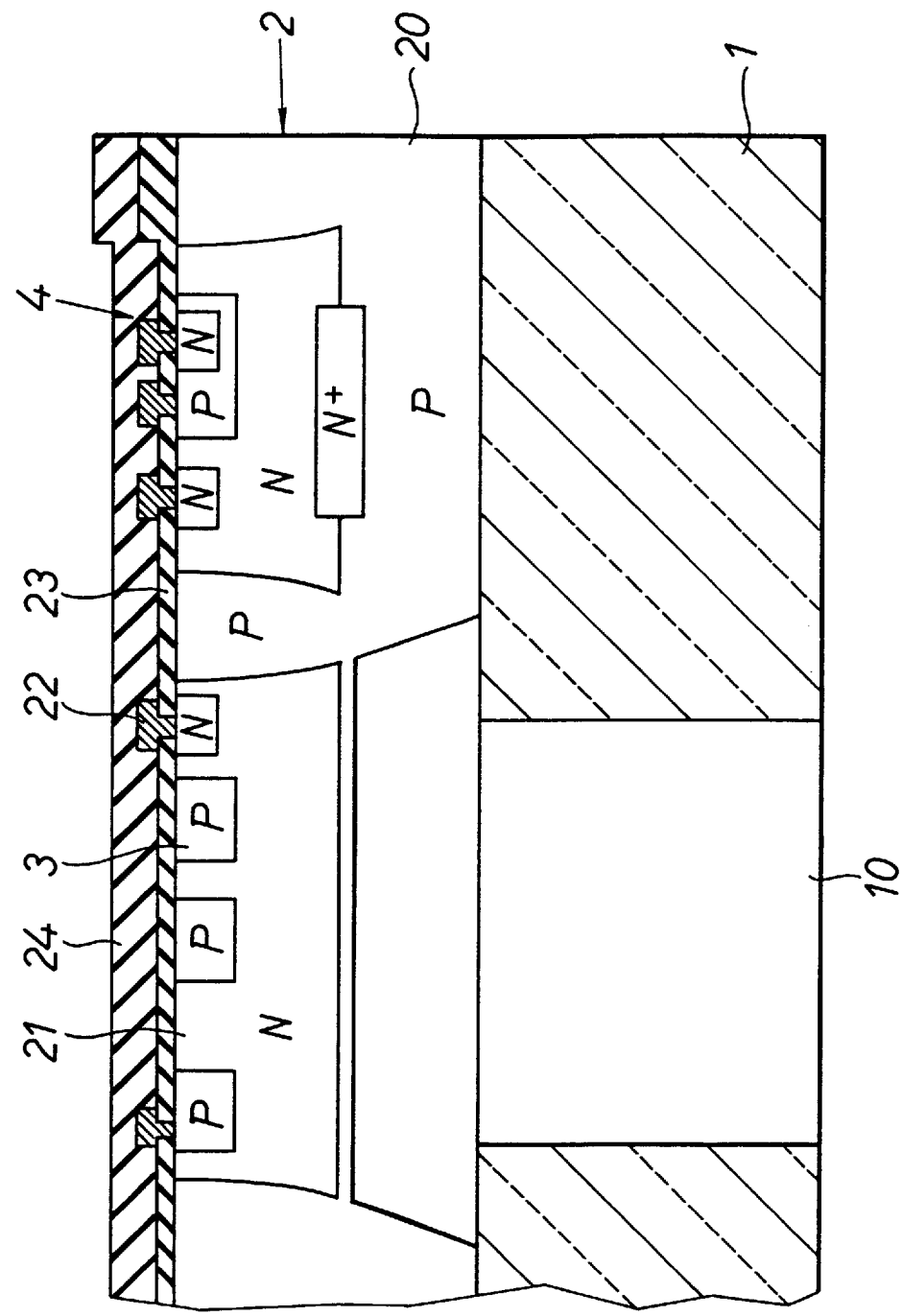
FIG. 1 is a sectional view illustrating an embodiment of a built-in amplification circuit type semiconductor pressure sensor according to the present invention.

As described above, a built-in amplification circuit type semiconductor sensor according to the first aspect of the present invention comprises a semiconductor chip having integrated thereon a signal conversion portion for outputting a pair of signal voltages the difference between which corresponds to a physical quantity, a pair of signal amplification portions for amplifying the both signal voltages individually, and a subtraction portion for outputting a difference voltage between the amplified signal voltages outputted from the both signal amplification portions. The signal amplification portions are disposed in symmetrical positions on the chip.

As mentioned above, when the diced chip is fixed to a bonding member such as a stem or circuit board by an ordinary thermal bond (e.g. soldering), the residual stresses of the signal amplification portions that have occurred in the above-mentioned anodic bond of the pedestal are eased or new residual stresses are caused to occur due to the heat at the time of this thermal bond, whereby the output characteristics of the signal amplification portions fluctuate. The pair of signal amplification portions are disposed at mutually different positions on the chip, and therefore the state where the stresses are eased differs according to the position on the chip. For this reason, even when adjusting through adjustment of the trimming resistors before dicing, the output characteristics of the pair of signal amplification portions inconveniently vary due to the mitigation of the stresses that results from the thereafter succeeding thermal bond.

Assuming that the residual stress at an end surface (side) of the chip which is a free end thereof be 0, the above-mentioned residual stress has the tendency of, as a shift is made from each side of the chip toward the center point thereof, increasing monotonously. The distributed state of such an isostress line typically appears since the insulation film or metal film having a different thermal expansion coefficient exists all over the whole main surface of the silicon chip. Almost the same phenomenon occurs also with regard to an actual chip. Accordingly, since a square or rectangular chip has two pairs of sides, each pair of sides intersecting each other at a right angle, the residual stresses at the points having respectively the same distances as measured from corresponding parallel sides must be almost equal. In other words, the states of residual stress at symmetrical points on the chip must be substantially the same.

The following is to be noted. In this specification, that certain two points are located symmetrically about the center of the chip is defined to mean a case where these two points are located line-symmetrically about a line that connects the center point of the chip and a center point of a relevant side thereof, a case where those two points are located line-symmetrically about a line that connects the center point of the chip and a relevant apex thereof, and a case where those two points are located rotation-symmetrically (or point-symmetrically) about the center point of the chip which is a reference point. Accordingly, by disposing the pair of signal amplification portions at their symmetrical positions, it is possible to decrease the difference between the stress fluctuations at the positions of the both signal amplification portions to thereby decrease the fluctuations in the output characteristics of the both ones.

It is also to be noted that the "pair of signal amplification portions disposed in symmetrical positions" means a state wherein when the space (signal amplification portion disposition region) on the chip where one signal amplification portion is to be formed and the space on the chip where the other signal amplification portion is to be formed have been caused assumedly to overlap upon each other by being folded at a relevant reference line in the case of a line symmetry; and signed amplification portion disposition region have been rotated assumedly through an angle of 180° about a relevant reference point in the case of a rotation symmetry, the both spaces overlap (80% or more in terms of the area) each other. The remaining portions being each also disposed continuously to the corresponding overlapped portion. Also, the "space" (signal amplification portion disposition region) is defined to mean a region that includes all circuit elements (transistors, resistors and capacitors) and internal wirings and that is enclosed by a border line which connects their outer edges.

In the first aspect of the present invention, further, preferably, it is arranged to dispose the signal amplification portions in line-symmetrical positions each of which is spaced from the reference line by a distance that is ½ or less of the distance from the reference line to a relevant side.

According to this construction, by the both signal amplification portions being disposed in line-symmetrical positions, it is possible to suppress the variations in the output characteristics due to the residual stresses resulting from the thermal histories that act on the both signal amplification portions. In addition, since the both ones are situated close to each other, planar variations in the impurity concentrations of their semiconductor substrates are also decreased, with the result that more suppression of the fluctuations in the output characteristics is realized.

It is to be noted that in the above-mentioned construction it is preferable to dispose particularly the initial stage amplification circuits of the both signal amplification portions in the symmetrical positions.

Since the variations in the output characteristics (DC offset and sensitivity (amplification factor)) of the initial stage amplification circuits occupy a main portion of the variations in the output characteristics substantially of the signal amplification portions, the decrease in the variations in the output characteristics of the initial stage amplification circuits is the most important. Therefore, by setting the initial stage amplification circuits in their symmetrical positions, it is possible to achieve a remarkable improvement in decreasing the variations in the output characteristics.

Incidentally, the first aspect of the present invention can be applied not only to a pressure sensor embodied in the later description but also to every one of built-in amplification circuit type semiconductor sensors that are each of a system producing a difference between a pair of signal voltages.

On the other hand, a process for manufacturing a semiconductor sensor according to the second aspect of the present invention comprises: an element forming step of forming a signal conversion element and an adjusting resistance element on a wafer; a pedestal bonding step of bonding the wafer to a pedestal in a high temperature atmosphere; and a trimming step of trimming the adjusting resistance element to thereby decrease the variations in the output characteristics of the signal conversion element. The process further includes an assembling step of bonding the chip equipped pedestal that has been obtained by dicing the wafer and pedestal to a stem while the chip equipped pedestal is being heated, and in which an annealing step for heating the wafer and pedestal is performed between the pedestal bonding step and the subsequent trimming step.

According to this construction, the inconvenience of the residual stresses that have occurred due to the above-mentioned bondage between the wafer and the pedestal under a high temperature condition is eased by the heat in the assembling step that succeeds the trimming step. This causes a variation in the output characteristic that has been adjusted by trimming to be decreased by performing annealing after the pedestal bonding step and thereby removing the residual stresses.

Also, in the semiconductor strain sensor, since the step of forming the diaphragm and beam is executed by etching performed from the rear surface of the wafer before the execution of the pedestal bonding step, the above-mentioned damages that have been caused by the performance of the plasma treatment that is used at this time can be recovered by the execution of this annealing step. Accordingly, it is possible to decrease the fluctuations in the output characteristics due to the recovery of the above-mentioned damages that results from the temperature in the assembling step that succeeds the trimming.

Also, in a case where there is the metallization step wherein a metal film is adhered by vacuum deposition or sputtering onto the surface of the pedestal that is bonded to the stem, it is preferable that the above-mentioned annealing step be executed after the metallization step. According to this construction, the above-mentioned damages that are caused when the metallization layer is adhered by vacuum deposition or sputtering onto the rear surface of the pedestal bonded to the wafer, i.e., the mounting surface of the pedestal intended to be metal bonded (soldered) onto a support member such as the stem can be recovered by this annealing step. Accordingly, it is possible to decrease the fluctuations in the output characteristics due to the recovery of the above-mentioned damages that results from the temperature of the assembling step that succeeds the trimming.

Further, after the pedestal bonding step, if the trimming step is executed with the wafer/pedestal structure being half cut from the wafer side along each dicing line with part of the pedestal being left as is, it is preferable to execute the above-mentioned annealing step after the half-cutting step. According to this construction, since the wafer and pedestal are almost cut off by half-cutting operation, the residual stress becomes easy to mitigate, with the result that it is possible to enhance the annealing effect further.

Incidentally, the second aspect of the present invention can be applied not only to the semiconductor strain sensor but also to any one of semiconductor sensors wherein treatments or thermal treatments causing damages to the crystallinity of a wafer are performed between the element formation and the succeeding trimming and, after this trimming, a thermal step is carried out.

Preferred modes of the present invention will now be explained on the basis of embodiments thereof.

An embodiment of a semiconductor pressure sensor to which the present invention has been applied will hereafter be explained with reference to FIG. 1.

A square silicon chip 2 is bonded onto a block-shaped pedestal 1. The silicon chip 2 has a square-frame-like support portion 20, a rear main surface of which is bonded to the pedestal 1 and which is constructed at the entire peripheral portion of the silicon chip 2. A thinned diaphragm 21 is formed at a central part of the silicon chip 2. Strain gauges 3 are formed in the diaphragm 21. An amplification circuit portion 4 is formed in the support portion 20. A reference numeral 22 denotes an aluminum wiring, 23 denotes a silicon oxide film, and 24 denotes a protective film that is of $SiO_2$ system or SiN system or that consists of a laminate of the both systems of materials.

When the pressure that has been introduced through a pressure introduction hole 10 formed in the pedestal 1 fluctuates, the diaphragm portion 21 is strained and as a result the resistance value of the strain gauge 3 changes. This change is inputted as a change in the signal voltage to the amplification portion (the signal amplification portion and subtraction portion so referred to in the present invention) 4 where amplification is performed with respect thereto, whereby the thus amplified signal voltage is outputted to the outside.

Main circuits that have been integrated on the silicon chip 2 will now be explained with reference to FIG. 2.

Four strain gauges 3 constitute a bridge circuit (the signal conversion portion so referred to in the present invention). In this bridge circuit, reference numerals 31 and 32 denote laser-trimming resistors and reference numerals 33 denote resistors that limit the current that flows in the trimming resistors 32. One of the input terminals of this bridge circuit is grounded and the other input terminal has a power supplied from a constant current circuit 35. Signal voltages V1 and V2 that are outputted from a pair of output terminals of the bridge circuit are amplified individually by amplifiers (signal amplification portions) 41 and 42 of the amplification portion 4 and are thereby converted to amplified voltages V' and V2', whereby a difference voltage therebetween $\Delta V=$ (V1'−V2') is calculated by a subtraction circuit (the subtraction portion so referred to in the present invention) 43 and is outputted.

Figure 2:
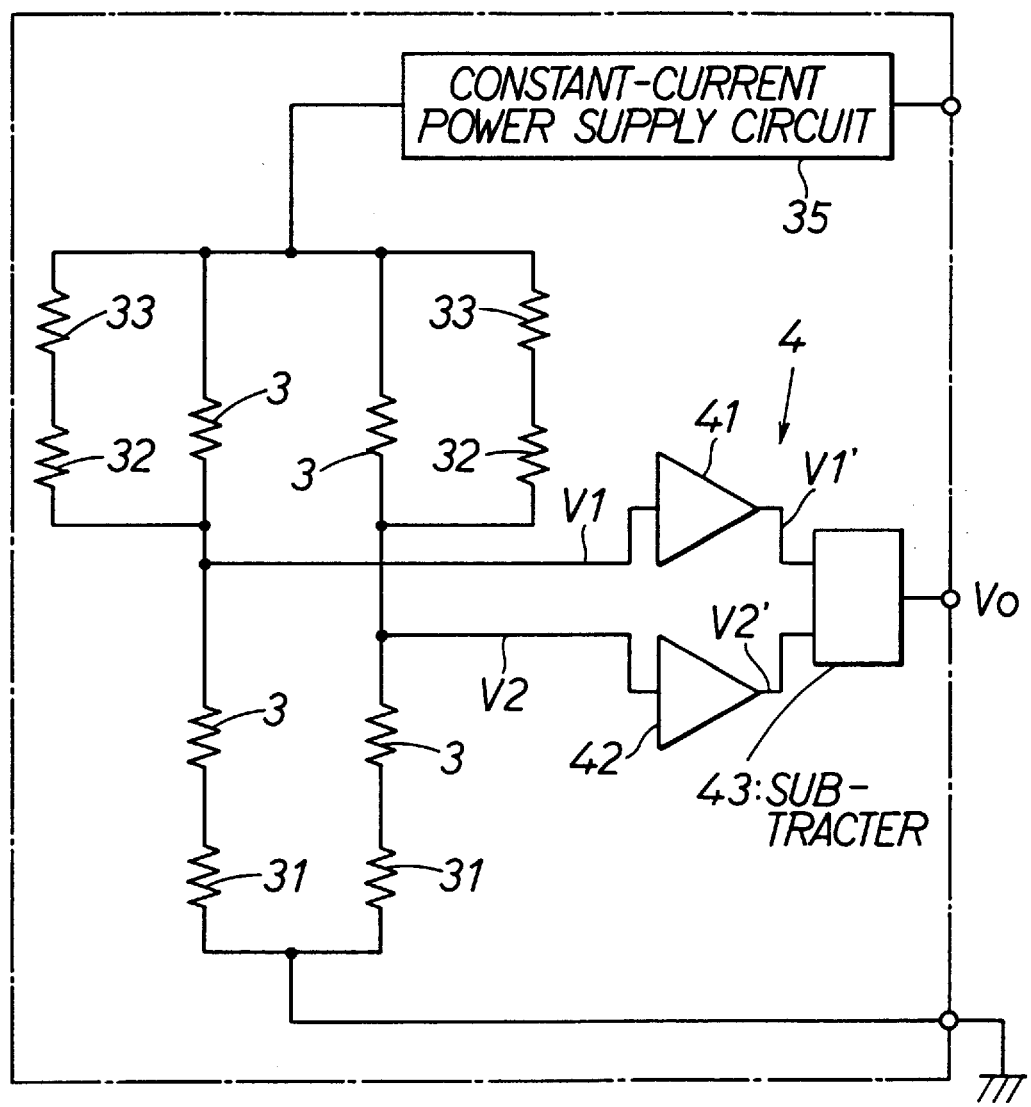
FIG. 2 is a block circuit diagram illustrating the sensor of FIG. 1.
Figure 3:
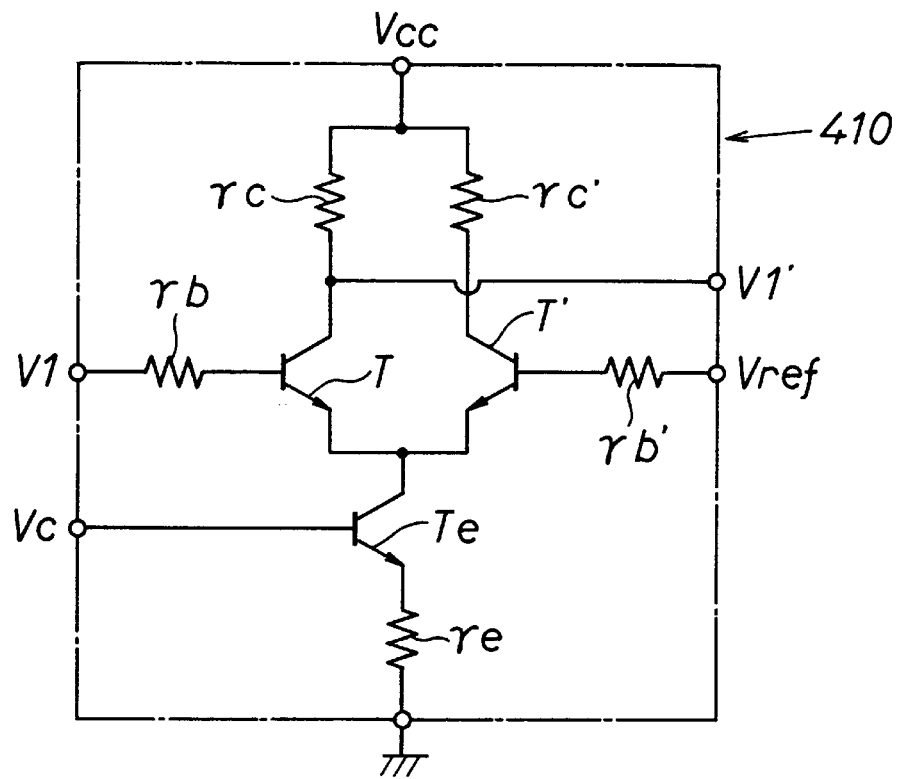
FIG. 3 is a circuit diagram illustrating an initial stage amplification circuit of amplifiers 41 and 42 of FIG. 2.

In FIG. 3 there is illustrated an example of an initial stage amplification circuit 410 of each of the amplifiers 41 and 42 of FIG. 2.

This initial stage amplification circuit 410 is an ordinary bipolar differential amplifier. Through base resistors rb and rb', the signal voltage V1 and reference voltage Vref are inputted to the bases of transistors T and T'. The amplified voltage V1' is outputted from the collector of the transistor T. Reference symbols rc and rc' denote collector resistors, a reference symbol Te denotes a transistor for limiting the emitter current, and a reference symbol re denotes an emitter resistor.

Figure 4:
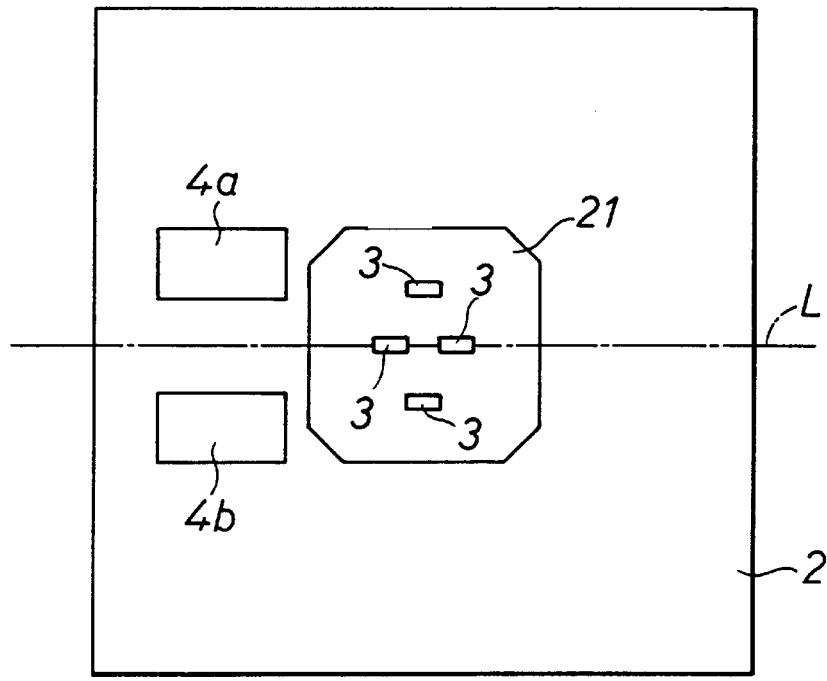
FIG. 4 is a chip plan view illustrating the sensor of FIG. 1.

FIG. 4 is a schematic plan view illustrating the silicon chip 2.

The diaphragm portion 21 is formed at the center of the chip and the four strain gauges 3 are formed on the diaphragm portion 21. A reference symbol 4a denotes a space (region) where the amplifier 41 is to be formed, and a reference symbol 4b denotes a space (region) where the amplifier 42 is to be formed. The both regions 41 and 42 are formed mirror-symmetrically about a line-symmetrical reference line L, connecting a center point of the chip and center points of the parallel sides, which serves as a reference line. When the chip has been folded at the line-symmetrical reference line L, the both regions 4a and 4b overlap to each other by 90% or more. Also, the transistors T', T and Te and the resistors rb, rb', re, rc and rcw in one of the regions 4a and 4b are also disposed line-symmetrically with respect to those in the other one of the regions.

Figure 5:
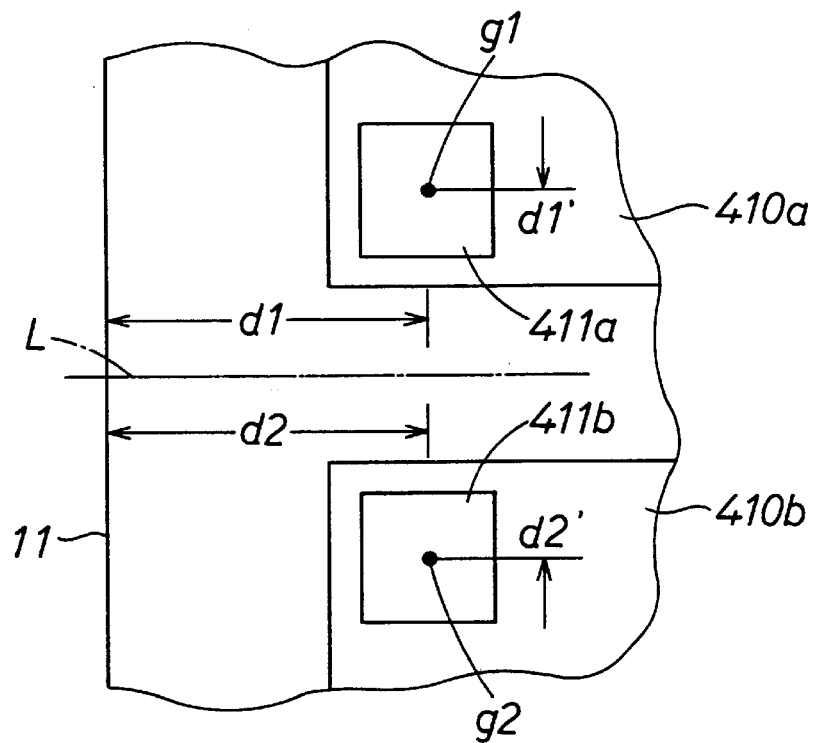
FIG. 5 is a partly enlarged plan view of FIG. 4.

In FIG. 5 illustrates a part of a region 410a where the initial stage amplification circuit 410 of the amplifier 41 is to be formed and a part of a region 410b where the initial stage amplification circuit 410 of the amplifier 42 is to be formed. Reference symbols 411a and 411b, respectively, denote regions in which the transistors T are to be formed. Two-dimensional positions of the center of gravity g1 and g2 are disposed at positions spaced from one side 11 of the silicon chip 2 by distances d1 and d2 respectively. Also, the positions of the center of gravity g1 and g2 are disposed at positions spaced by distances d1' and d2' from two sides that intersect the side 11 of the silicon chip 2 orthogonally thereto. Of course, in the embodiment, the distances d1 and d2 are made to coincide with each other, and further the distances d1' and d2' are made to coincide with each other.

Similarly, the transistor Te and resistors rb, rb', re, rc, and rc' illustrated in FIG. 3 also have their respective distances d1 and d2 and distances d1' and d2' made to be respectively as coincident with each other as possible. That is, the disposition positions of the regions 4a and 4b of the amplifiers 41 and 42 are not only in symmetry with each other but are the two-dimensional positions of the center of gravity of the individual mating transistors and resistors also disposed in line-symmetry with each other. By this arranging, the distances of each of the paired mirror image disposed regions as measured from all sides of the silicon chip 2 become equal, whereby the states of the residual stresses in each region become equalized. This brings about the effect that the output characteristics of the amplifiers 41 and 42, especially their initial stage amplification circuits 410, coincide with each other.

Figure 6:
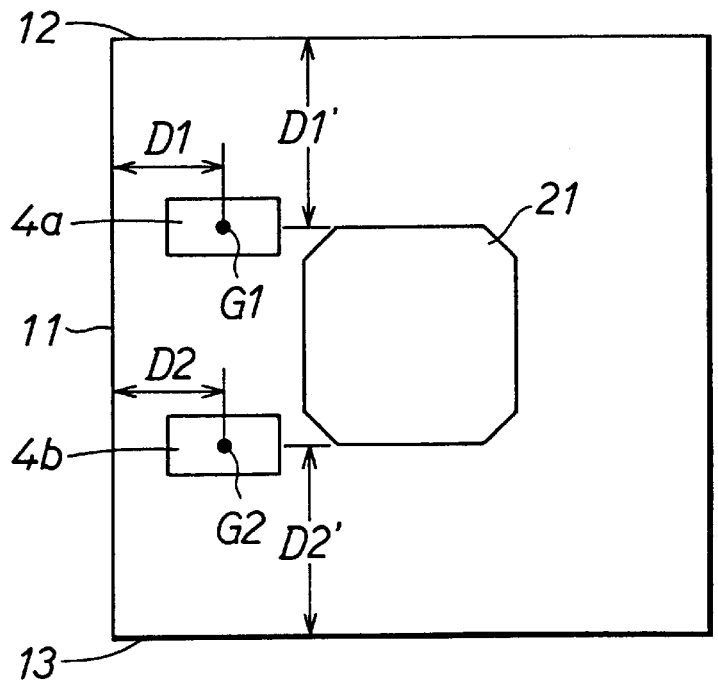
FIG. 6 is a plan view illustrating a prototype chip that is used in the sensor according to the embodiment of the present invention.

FIG. 6 is a layout view of a specimen which was used to measure the amounts of thermal fluctuations V1' and V2' of the offset voltages of the operational amplifiers 41 and 42. The measurements were made under no pressure application in the case where the temperature elevation was raised up to a soldering temperature (approximately 300° C.) under the assumption that in the silicon chip 2 illustrated in FIG. 4, the two-dimensional position of the center of gravity of the region 4a for the amplifier 41 was represented by G1 and that of the region 4b for the amplifier 42 was represented by G2; and that the distances from G1 and G2 to the side 11 were represented by D1 and D2, respectively, and the distances from G1 and G2 to the sides 12 and 13 were represented by D1' and D2', respectively, with D1=D2= approximately 0.42 mm and D1'=D2'=approximately 0.85 mm. The number of the specimens was 20, the dimension of one side of the chip 2 was approximately 3.00 mm and the area of the diaphragm portion 21 was approximately. 0.71 $mm^2$. As described later, it is assumed here that the silicon chip 2 is bonded to the pedestal 1 by anodic bond and the pedestal 1 is fixed to a metal stem by soldering.

Figure 8:
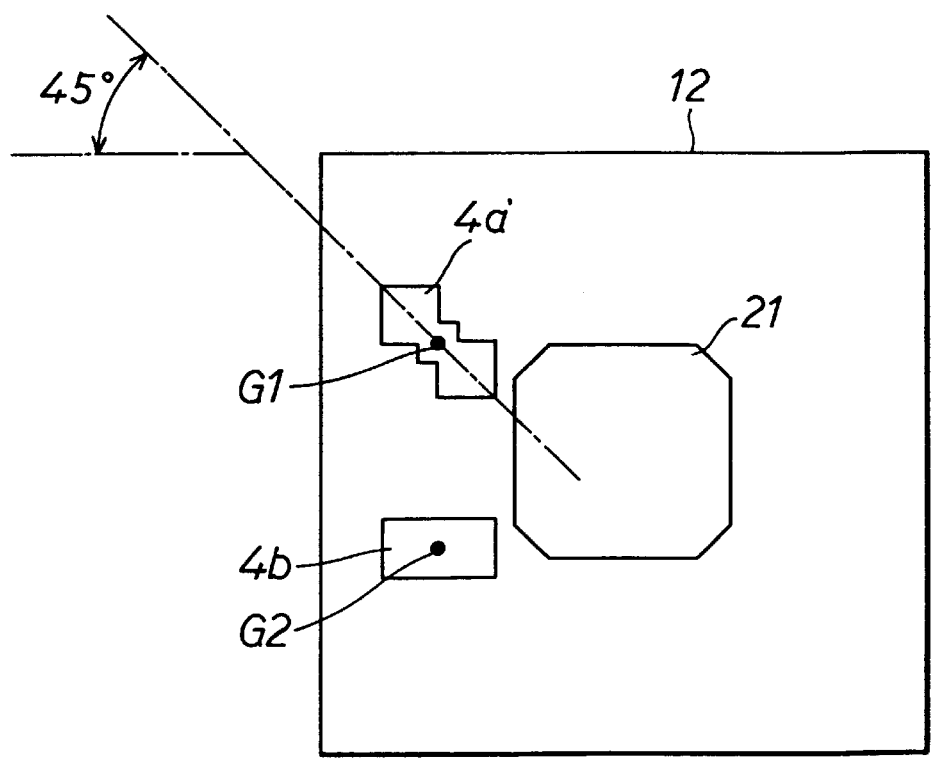
FIG. 8 is a plan view illustrating a chip as a comparative example.

FIG. 8 illustrates a layout view of a comparative example, in which the two-dimensional position of the center of gravity G1 of the region 4a' where the amplifier 41 is to formed the D1 is set to be 0.53 mm and the D1' is set to 0.81 mm with the extension direction of the region 4a' defines a 45 degrees angle with respect to the side 12 and with the remaining conditions being the same as in FIG. 6.

Figure 7:
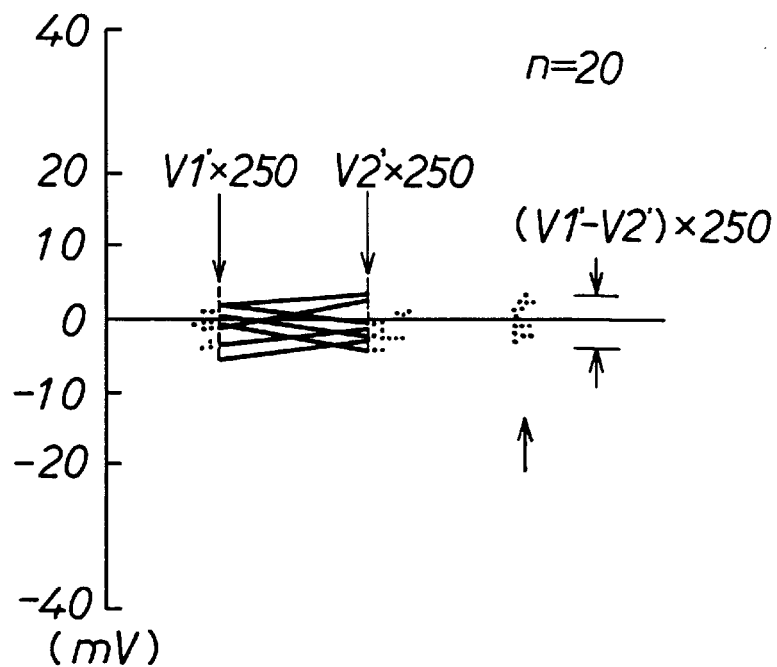
FIG. 7 is a characteristic diagram illustrating the variations in the output characteristics of the chip of FIG. 6.
Figure 9:
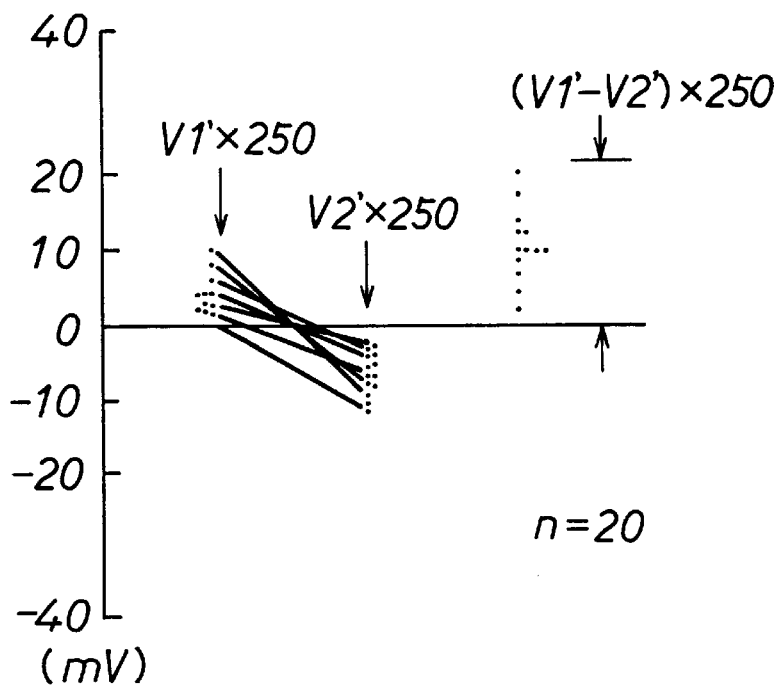
FIG. 9 is a characteristic diagram illustrating the variations in the output characteristics of the chip of FIG. 8.

The output characteristics of the sensor (the product according to the embodiment) of FIG. 6 are illustrated in FIG. 7 and those of the sensor (the product according to the comparative example) of FIG. 8 are illustrated in FIG. 9.

From FIGS. 8 and 9, it is understood that the variation of the output characteristic of the product according to the embodiment. The DC offset voltage (V1'−V2'), in this case, can be decreased down to ¼ or less of that of the product according to the comparative example.

Furthermore, as described above, the positions of the center of gravity G1 and G2 of regions 4a and 4b are disposed in line-symmetrical positions about the line-symmetrical reference line L (FIG. 5) and are each spaced from the reference line L by a distance of approximately 0.65 mm that is ½ or less of the distance from the reference line L to a relevant side 12 or 13. According to this construction, both amplifiers 41 and 42 are situated close to each other, planar variations in the impurity concentrations of diffusion regions making up semiconductor elements such as transistors and resistors are also decreased, resulting in more suppression of the fluctuations in the output characteristics.

Modified examples will now be explained with reference to FIGS. 10A and 10B.

Figure 10A:
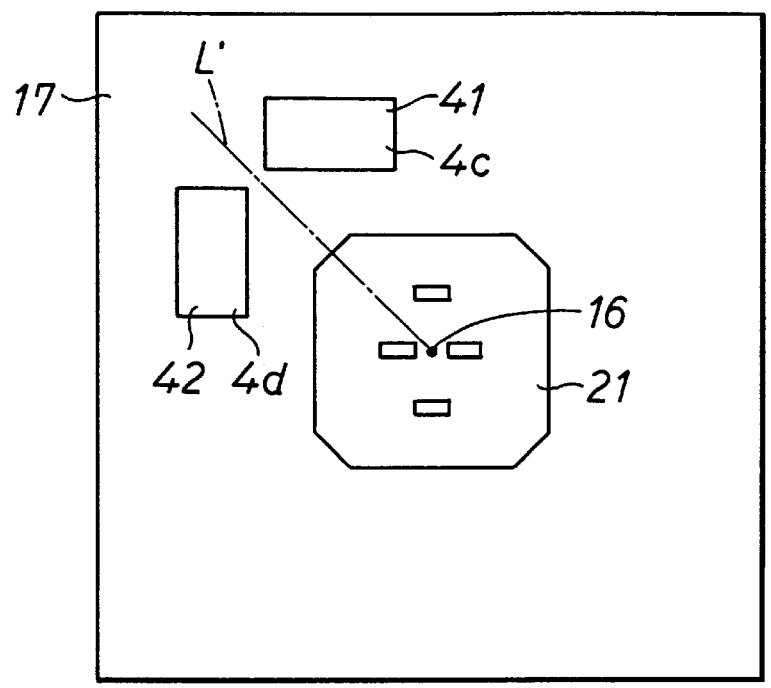
FIGS. 10A and 10B are chip plan views illustrating modified sensors.
Figure 10B:
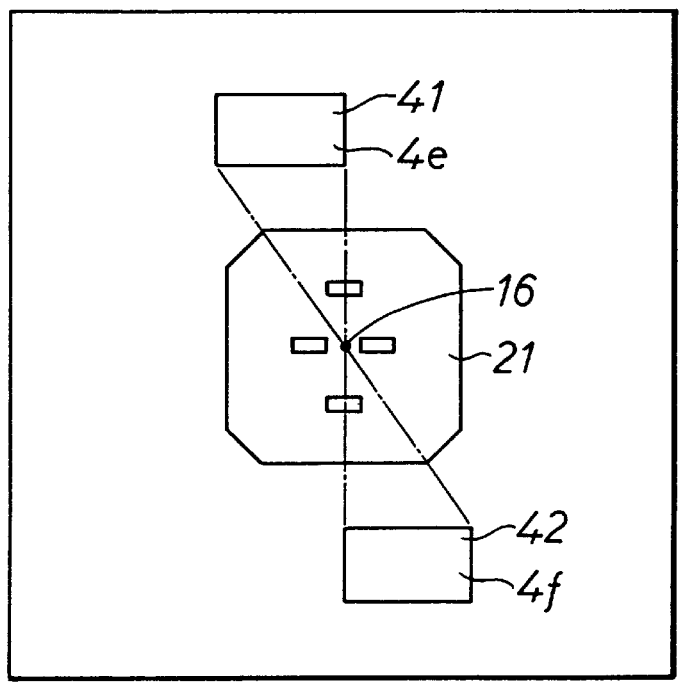

In the example of FIG. 10A, the line-symmetrical reference line L' for both regions 4c and 4d is a straight line that connects a chip center point 16 and an apex 17. Also, in the example of FIG. 10B, both regions 4e and 4f that respectively become the amplifiers 41 and 42 are set at positions that are point-symmetrical with respect to the chip center point 16. Further mating ones of the individual circuit elements are also disposed at positions that are point-symmetrical with respect to the chip center point 16. In these cases also, the same effect as mentioned above can be brought about.

The following is to be noted. The above-mentioned embodiment has been directed to disposing the amplifiers 41 and 42 as well as the circuit elements therefor reliably in symmetrical positions. However it is sufficient that, under the assumption shown in FIG. 5 that the distance from the two-dimensional position of the center of gravity g1 of a first circuit element 411a disposed within the corresponding initial stage amplification circuit 410a to a relevant side 12 of the chip is represented by d1' and the distance from the two-dimensional position of the center of gravity g2 of a second circuit element 411b disposed within the other initial stage amplification circuit 410b and paired with the first circuit element to a relevant side 13 of the chip is represented by d2', there exists between the first and second circuit elements the symmetry precision that the difference between the both distances Δd=(d1'−d2') be less than 15%, preferably less than 10%, of the mean therebetween dm= (d1'+d2')/2.

In the above construction, linear amplification circuits each composed of an operational amplifier are used usually as the above-mentioned amplifiers 41 and 42; however, other amplification circuits may of course be usable. In a simple manner, as the subtraction circuit 43, it is suitable to use an inversion circuit for inverting the amplified signal voltage V2' and an addition circuit, based on the use of an operational amplifier, for adding the output voltage therefrom and the amplified signal voltage V1'. However, a subtraction circuit that uses a differential amplifier circuit can be also used as the subtraction circuit 43.

Additionally, although in the above-mentioned embodiments the configuration and the center of gravity of the space (semiconductor element disposition region) where each circuit element is to be formed have been disposed line-symmetrically or point-symmetrically, if the configuration of each metal wiring over the space (semiconductor element disposition region) is also disposed line-symmetrically or point-symmetrically, it is possible to mitigate also the variations in the residual stresses that are attributable to the difference in thermal expansion coefficient between these metal wirings and an insulation film or semiconductor adjacent thereto. However, since the metal wiring per se is drawn around, it is difficult to form the metal wirings into a complete symmetrical image relationship with each other. In this case, it is effective to dispose a dummy metal wiring having no significant function at the same symmetrical position as that at which the mating metal wiring is disposed.

Next, an example of a process for manufacturing the semiconductor pressure sensor according to the second aspect of the invention will be explained.

Figure 11A:
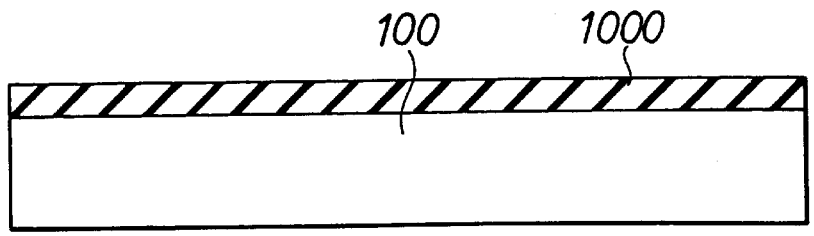
FIGS. 11A through 11I are sectional views illustrating sequentially chip manufacturing steps of a process for manufacturing a semiconductor pressure sensor according to an embodiment of the present invention.

A silicon wafer 100 having a plane orientation of (110) or (100), wherein an N-type layer has been epitaxially grown on a P-type semiconductor substrate, is prepared and then this silicon wafer 100 is heat treated (800° to 1,100° C., oxidation with $O_2$ or wet $O_2$) to thereby form a $SiO_2$ film 1000 having a thickness of from 500 to 1,000 nm (FIG. 11A).

Figure 11B:
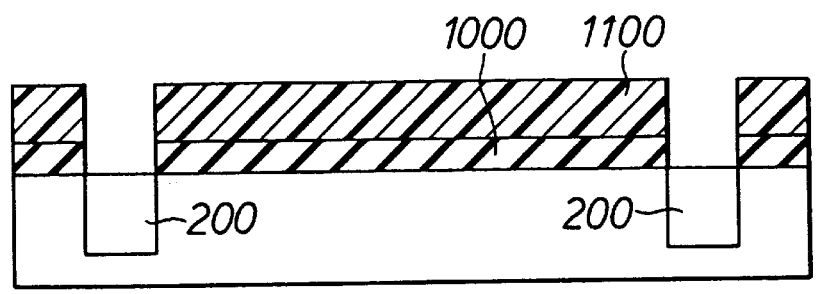

Next, there is formed a resist pattern 1100 that has had openings formed therein with a wiring pattern for the formation of diffusion wiring layers (resistor drawing-out wires). Then, the oxide film 1000 within the opening is selectively removed by wet etching that uses a solution of HF system or dry etching that uses a $CF_4$ gas, whereupon there are formed P-type regions that serve as the wiring layers 200 (FIG. 11B).

Figure 11C:
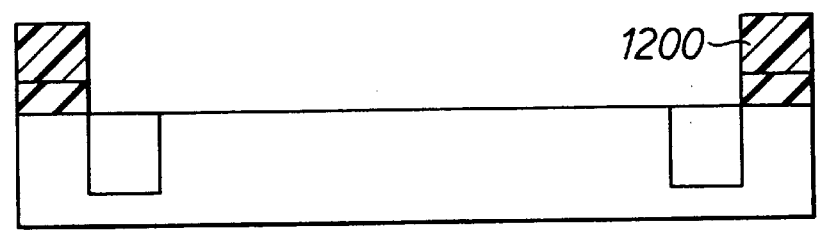

Next, there is formed a resist pattern 1200 that has had an opening formed therein in correspondence with a diaphragm formation region, whereupon the oxide film 1000 within the opening is selectively removed by wet etching or dry etching as illustrated in FIG. 11C.

Figure 11D:
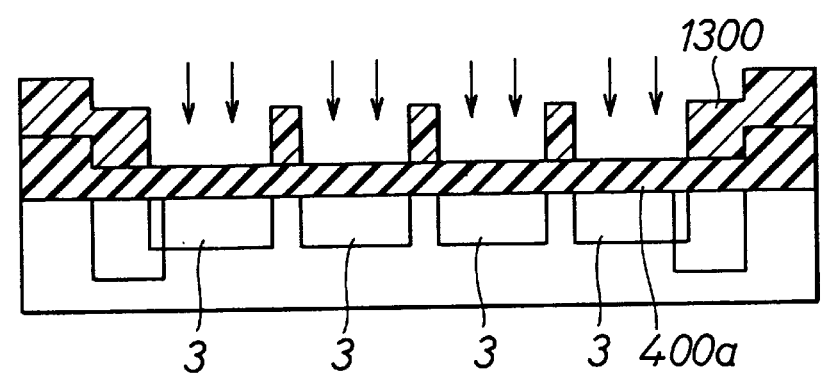

Next, after the removal of the resist pattern 1200, a $SiO_2$ film 400a having a thickness of 50 to 200 nm is formed by wet oxidation or dry oxidation (800° to 1,100° C., $O_2$ or wet $O_2$ oxidation). Thereafter, there is formed a resist pattern 1300 that has had openings formed over regions predetermined to have gauge resistors formed therein, whereupon boron is ion implanted with respect thereto, thereby forming strain gauges 3 (FIG. 11D).

Figure 11E:
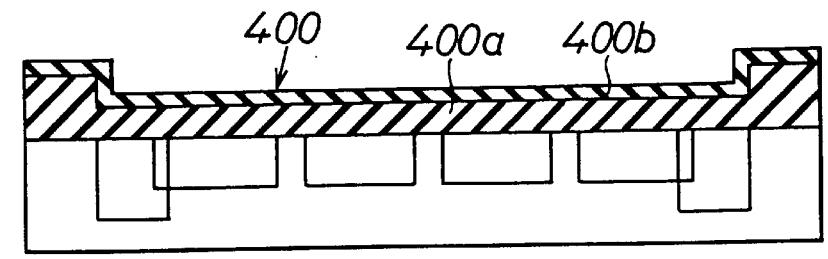

Then, the resist pattern 1300 is removed, whereupon the resulting structure is heat treated (900° to 1,000° C., 30 to 60 minutes) in $POCl_3$ to thereby diffuse phosphorus into the $SiO_2$ film 400a and thereby form a PSG film 400b. Through the execution of the above-mentioned steps, over the diaphragm, there is formed a first protective film 400 that is made up of a two-layer oxide film having excellent resistance to environment (FIG. 11E).

Figure 11F:
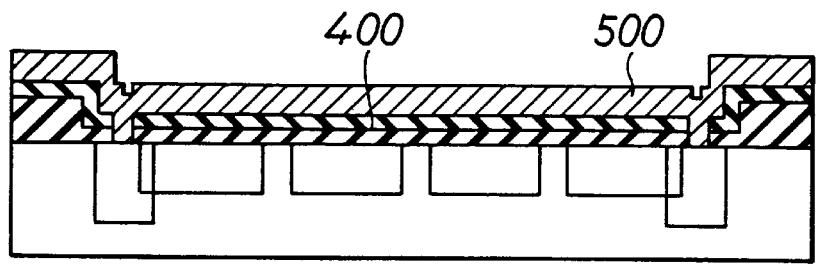

Next, there is formed a resist pattern that has had openings formed therein in correspondence with contact portions to thereby selectively remove the first protective film 400 by wet or dry etching and thereby form contact holes. Thereafter, the resist is removed, whereupon an aluminum film 500 is deposited over the entire surface of the resulting structure to thereby obtain a structure that is illustrated in FIG. 11F.

Figure 11G:
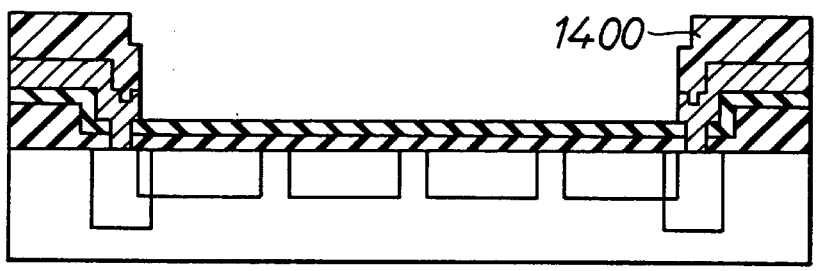
Figure 11H:
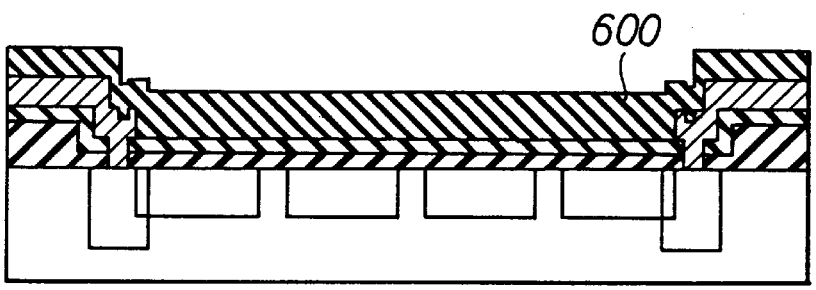

Next, a resist pattern 1400 is formed so that the aluminum film 500 is covered along the aluminum wiring pattern, whereupon wet etching using a mixed solution of nitric acid and phosphoric acid is performed to pattern the aluminum film 500 (FIG. 11G). Then, after the removal of the resist, a second protective film 600 is deposited (FIG. 11H).

Figure 11I:
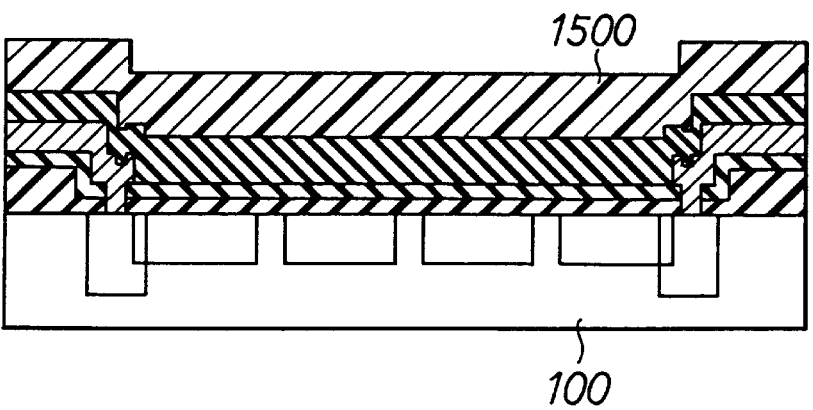

Next, a resist pattern 1500 that has had openings formed therein in correspondence with pad formation regions (whose illustration is omitted) is formed, whereupon the second protective film 600 is selectively removed to thereby expose portions of the aluminum film 500 that become the pads (FIG. 11I). As a result of the execution of the above-mentioned steps, the wafer 100 having the strain gauges, other circuit elements, etc. are formed therein. It is to be noted that the adjusting resistance elements (not illustrated) for laser trimming are also formed on the wafer 100 through the execution of known steps. It is also to be noted that after completion of the above-mentioned element forming steps, there was performed, as in the prior art, the annealing process (annealing that was done after completion of the element forming process) wherein the wafer 100 was maintained at 450° C. for 30 minutes and thereafter slow cooled.

Next, the rear surface of the wafer is ground, and the wafer is thereby adjusted to a prescribed thickness, whereupon the rear surface thereof is subjected to plasma cleaning. Thereafter, a plasma silicon nitride film is formed on the rear surface of the wafer by a plasma enhanced CVD technique. Further, on the rear surface thereof is formed a resist pattern that has had an opening formed therein in correspondence with the position of the diaphragm formation region, whereupon plasma dry etching is performed to thereby remove selectively the plasma silicon nitride film through the opening formed in the resist and expose the region of the rear surface of the wafer 100 that is to be etched by electrochemical etching described hereunder. Then, the residual resist is removed. It is to the be noted that, in order to perform electrochemical etching, an opening is also formed beforehand similarly in the surface of the wafer 100 for the purpose of making electrode connection with respect to the wafer 100.

Next, electrochemical etching is performed with respect to the wafer 100.

Figure 12:
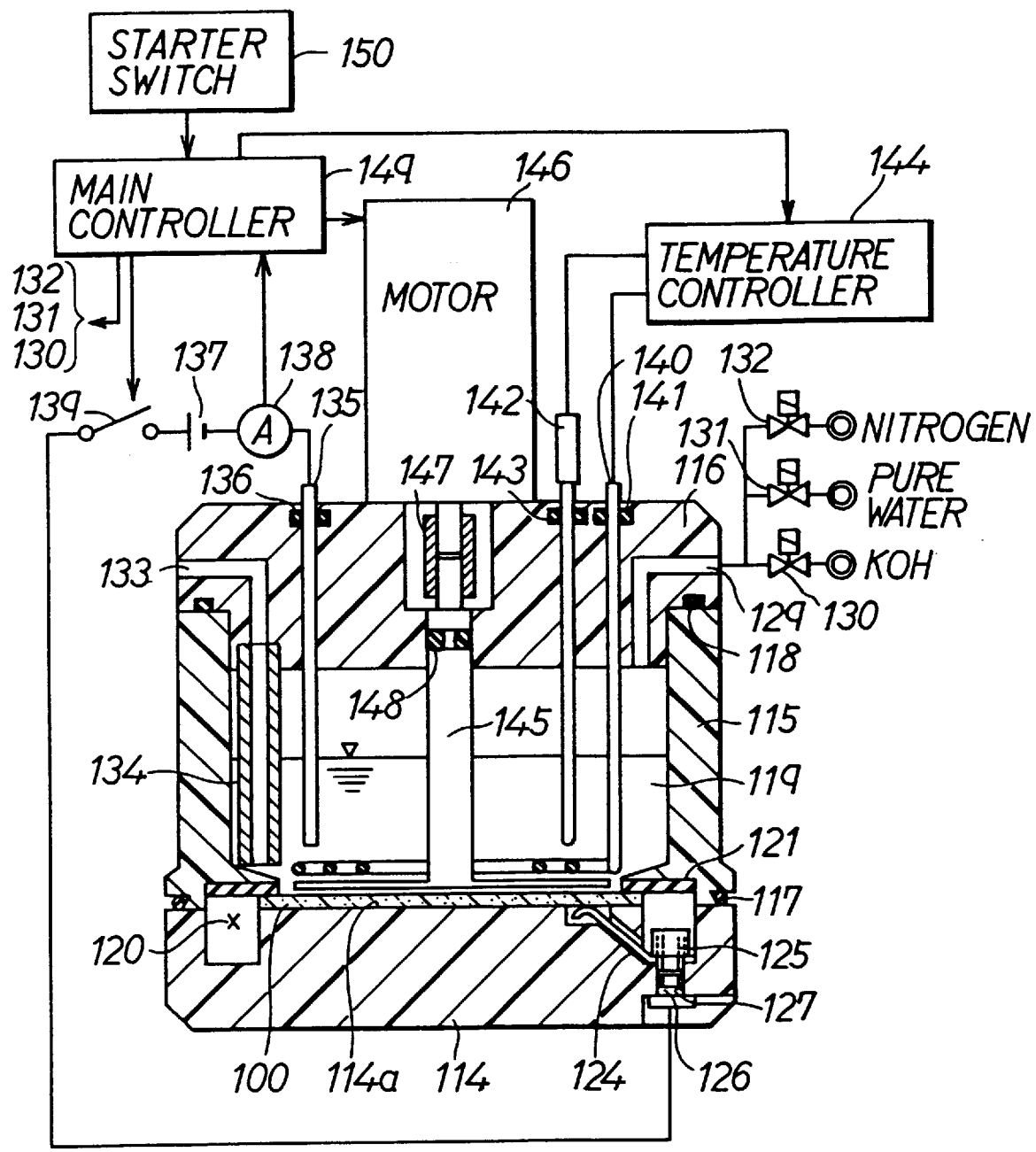
FIG. 12 is an overall constructional view illustrating an electrochemical etching apparatus.

FIG. 12 is a schematic construction view of an electrochemical etching apparatus for use in forming the diaphragms 21 over the silicon wafer 100.

The electrochemical etching apparatus comprises a base 114, a cylindrical frame body 115 and a lid body 116. These elements are made of tetrafluoroethylene resin, for example, and therefor high in dielectric strength, heat resistance and corrosion resistance. The bottom surface open end of the frame body 115 is arranged on the base 114 so as to be liquid-tightly held by an O-ring 117, and the top surface open end of the frame body 115 is arranged on the lid body 116 so as to be liquid-tightly held by an O-ring 118. The base 114, the frame body 115 and the lid body 116 compose a liquid-tight container which can hold 33 wt % KOH solution 119 of an alkali anisotropic etchant.

A top surface 114*a* of the base 114 is a flat and smooth substrate mounting surface. On this top surface 114 there is arranged the silicon wafer 100 to be etched in such a way that the P-type (110)-oriented silicon substrate 2 of the silicon wafer 100 can face upward with the surface thereof being in contact with the 33 wt % KOH solution 119, and the metallic film 500 which is connected to an N-type region within the diaphragm 21 of the silicon wafer 100 being in contact with the top surface 114*a* of the base 114.

On the circumferential part of the top surface (substrate mounting surface) 114*a* of the base 114 is annularly provided a negative pressure chamber forming concave part 120. On the bottom surface of the frame body 115 is fixed a ringed packing 121. This ringed packing 121 closes the open part of the negative pressure chamber forming concave part 120 while enclosing the outer circumferential end of the silicon wafer 100. In this arrangement, when the inside of the negative pressure chamber forming concave part 120 is evacuated by a vacuum pump or the like (not illustrated), the packing 121 is sucked and the silicon wafer 100 is immovably fixed. In this way, the application of masking to the etching surface at the outer circumferential edge of the silicon wafer 100 is achieved by the packing 121. Furthermore, by this evacuation, both the base 114 and the frame body 115 are sucked and fixed.

Figure 13:
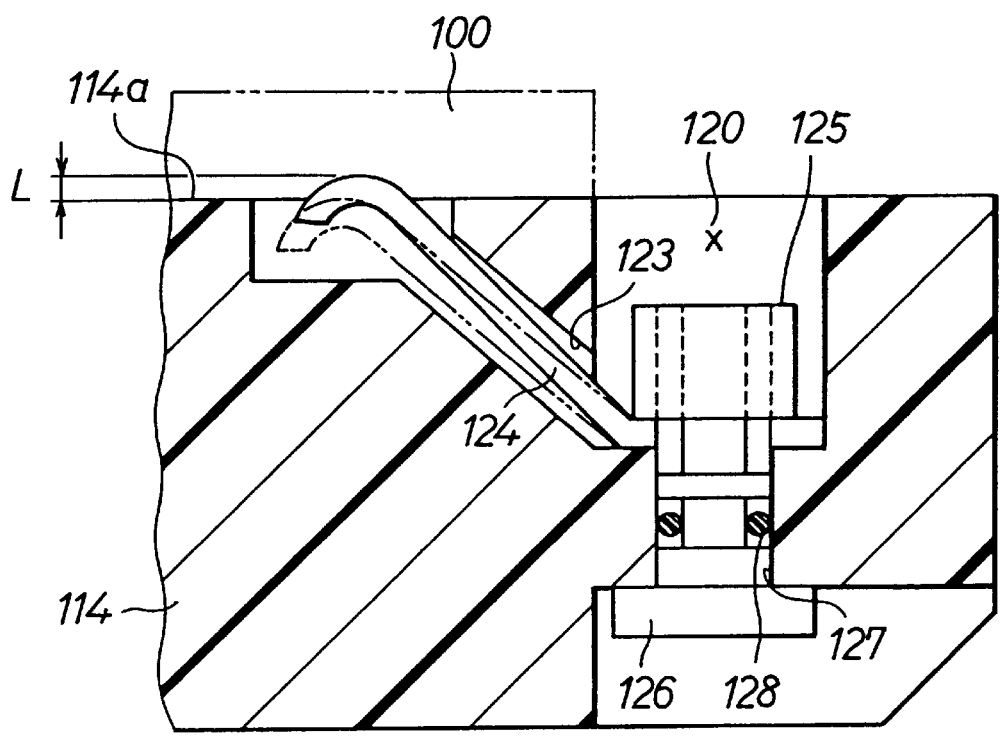
FIG. 13 is a partly sectional view of FIG. 12.

As illustrated in FIG. 13, a passage 123 is formed in the base 114 to communicate the top surface (substrate mounting surface) 114*a* and the negative pressure forming concave part 120 with each other. In this passage, an anodic electrode 124 disposed therein. In the negative pressure forming concave part 120, an end of the anodic electrode 124 is connected to a pin 126 by a nut 125. The pin 126 is exposed to an outer part of the base 114 through a communication hole 127, and air-tightly held by an O-ring 128. The other end of the anodic electrode 124 is positioned above the top surface 114*a* of the base 114 by a distance of L when the silicon wafer 100 is not yet mounted. When the silicon wafer 100 is mounted on the top surface 114*a* of the base 114, however, the other end of the anodic electrode 124 is deflected to a position indicated by a chain line with two dots in FIG. 13. In this way, voltage can be applied to the silicon wafer 100 with the anodic electrode 124 being in contact with the metallic film 500 of the silicon wafer 100 at a certain contact pressure.

In FIG. 12, a supply passage 129 reaching the frame body 115 is formed in the lid body 116 to supply 33 wt % KOH solution through a valve 130, pure water through a valve 131 and nitrogen gas through a valve 132. On the other hand, a drain passage 133 communicating the inside and the outside with each other is formed also in the lid body 116. An end of this drain passage 133 is open to the bottom part inside the frame body 115 through a pipe 134. It is through the pipe 134 and the drain passage 133 that the 33 wt % KOH solution 119 and the pure water within the frame body 115 can be drained.

A bar-shaped cathodic electrode 135 is disposed in penetration through the lid body 116 and air-tightly held by an O-ring 136. This cathodic electrode 135 extends into the 33 wt % KOH solution 119 within the frame body 115 to a certain depth. Between the cathodic electrode 135 and the anodic electrode 124, a DC power source (1–10V) 137, and an ammeter 138 and a contact 139 are compatible in series. By closing the circuit with the contact 139, the potential difference is applied to the cathodic electrode 135 and the anodic electrode 124 from the DC power source (1–10V) 137. At this time, the current flowing from the silicon wafer 100 to the cathodic electrode 135 is detected by the ammeter 138.

A heater 140 is disposed in penetration through the lid body 116, and the air-tightness therebetween is maintained by an O-ring 141. When the heater 140 is electrically energized, the heater 140 generates heat and thereby the temperature of the 33 wt % KOH solution 119 is raised. A temperature sensor 142 is disposed in penetration through the lid body 116, and air-tightness is maintained by an O-ring 143. This temperature sensor 142 detects the temperature of the 33 wt % KOH solution 119. While monitoring the temperature of the 33 wt % KOH solution 119 detected by the temperature sensor 142, a temperature controller 144 maintains the temperature of the 33 wt % KOH solution 119 at 110° C. by electrically energizing and controlling the heater 140.

Within the frame body 115, stirring blades 145 are disposed. The stirring blades 145 are rotated by a motor 146 mounted on the lid body 116 through a coupling 147, and thereby the 33 wt % KOH solution 119 is stirred. The air-tightness between the stirring blades 145 and the lid body 116 is maintained by an O-ring 148.

A main controller 149 detects the start of the etching based on the signal from a starter switch 150, and at the same time, detects the flowing current based on the signal from the ammeter 138. Furthermore, the main controller 149 drives and controls the contact 139, the motor 146, the temperature controller 144 and the valves 130 through 132. The main controller 149 is composed mainly a microcomputer.

In the etching procedures, as illustrated in FIG. 12, the silicon wafer 100 is disposed on the top surface 114a of the base 114, the inside of the negative pressure chamber forming concave part 120 is evacuated, and the silicon wafer 100 is fixed by the packing 121. When the main controller 149 receives an etching start signal from the starter switch 150, the main controller 149 starts a processing for electrochemical etching. Concretely, the main controller 149 opens the valve 130 and admits a specified quantity of the 33 wt % KOH solution 119 into the liquid-tight container. Then, the main controller 149 stirs the 33 wt % KOH solution 119 with the stirring blades 145 and on the other hand, maintain the temperature of the 33 wt % KOH solution 119 at 110° C. through the temperature controller 144 that controls the heater 140 in the live state. From this state, the main controller 149 closes the contact 139 and reads a varying current value measured by the ammeter 138.

When the main controller 149 judges from the varying current value measured that the electrochemical etching operation is to be terminate, the main controller 149 drains the 33 wt % KOH solution 119, opens the valve 131, and cleans the inside of the liquid-tight container with the pure water. After the completion of the cleaning, the main controller 149 closes the valve 131, stops the stirring blades 145, and opens the contact 139 and terminates electric energizing. Then, the main controller 149 opens the valve 132 and supplies the nitrogen gas into the liquid-tight container, and thereby discharges the pure water and dry the inside. Next, the main controller 149 releases the negative pressure from the inside of the negative pressure chamber forming concave part 120, separates the base 114 and the frame body 115 from each other, and takes out the treated silicon wafer 100.

Next, the plasma nitride film (P-SiN) on the rear surface of the wafer that was used as masking material for performance of the electrochemical etching is removed by wet etching. By the above-mentioned electrochemical etching, recess portions 1a are formed in the rear surface of the wafer 100, with the result that diaphragms 21 are formed.

Figure 14A:
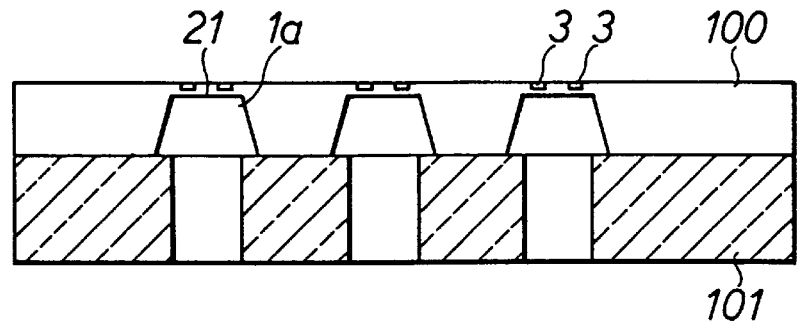
FIGS. 14A and 14B are sectional views illustrating steps of the process for manufacturing a semiconductor sensor element.

Thereafter, by the use of an anodic bonding technique, the wafer 100 is bonded to a pedestal plate (glass disc) 101 as shown in FIG. 14A. The anodic bonding steps will hereafter be explained. It is to be noted that the pedestal plate 101 is a pedestal in units of a wafer of the pedestal 1 illustrated in FIG. 1 that has been obtained by being diced in units of a chip.

A metallization film is formed beforehand on one surface (the metallization surface) of the pedestal plate 101 that consists of a flat plate having a number of through holes. The wafer 100 is placed on this pedestal plate 101 and the resulting structure is pinched by a pair of electrodes. AS the metallization film there has been adopted an Au/Ni/Ti film. The formation of this metallization film is performed in order to improve the wettability when the pedestal plate 101 (the pedestal 1) is soldered onto a metal stem in the later step.

Next, under an atmospheric condition of 357° to 363° C. and 1 to $10 \times 10^{-4}$ Pa, a DC voltage of 400 V is applied for around 10 minutes with the wafer 100 side being made to be positive. As a result of this, movement of oxygen ions from the pedestal 101 to the wafer 100 occurs, whereby a so-called anodic bond occurs.

Figure 14B:
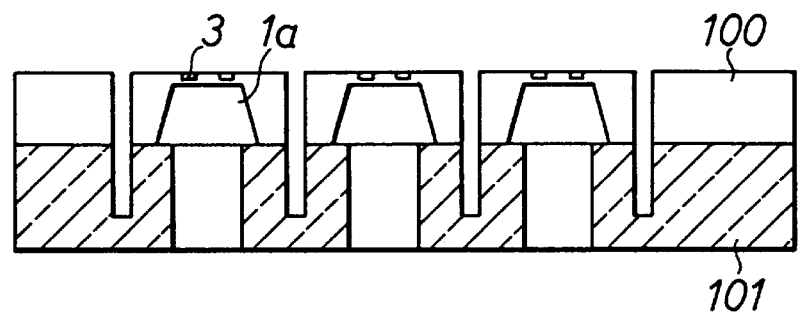

Next, half cutting (half dicing) of the pedestal plate 101 and wafer 100 is performed along chip dicing lines of the wafer 100 as shown in FIG. 14B.

Next, the wafer 100 is maintained at 450° C. for 192 minutes and slow cooling is performed to thereby conduct second-time annealing (first treatment). Of course, a vacuum atmosphere may be also used as the annealing atmosphere.

Next, the above-mentioned trimming resistors (the resistors 31 and 32 in FIG. 2) that has been formed on the wafer 100 are laser trimmed to cause the output characteristics to coincide with the standard characteristics, whereupon the wafer 100 and the pedestal plate 101 are completely diced along the grooves that have been formed by half cutting. The wafer structure is thereby separated into chip structures. At this time, the pedestal plate 101 is separated into the pedestal 1.

Figure 15:
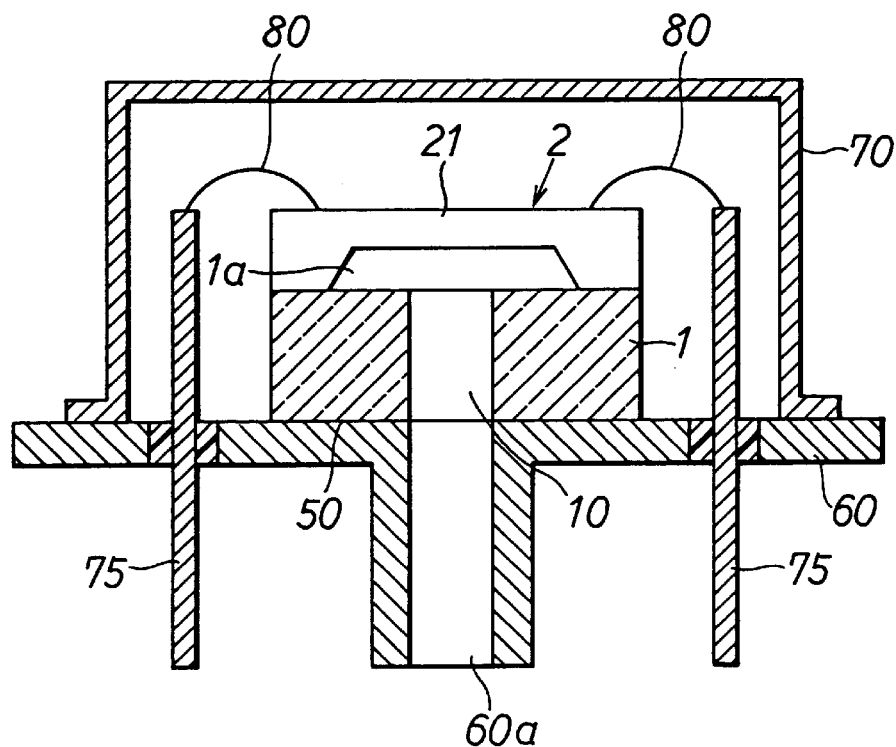
FIG. 15 is a sectional view illustrating a finished product of the semiconductor sensor.

Next, the chip-equipped pedestal 1 is soldered to the metal stem 60 at a temperature of approximately 310° C. Wire bonding is also performed. A metal can 70 is welded to the stem 60. Thus, assembly is finished (refer to FIG. 15). It is to be noted that, in FIG. 15, a reference numeral 75 denotes a lead pin that passes through the stem 60. The lead pin is hermetically sealed. A reference numeral 80 denotes a bonding wire, and a reference symbol 60a denotes a pressure introduction hole that is formed in the stem 60 and that communicates with the pressure introduction hole 10 of the pedestal 1.

According to this embodiment, since the annealing treatment (first treatment) is performed immediately before the execution of the trimming step, it is possible to decrease the variations in the output characteristics of the strain sensor for the previously stated reasons.

The effect that is obtained from this annealing treatment (first treatment) will next be explained.

Figure 16:
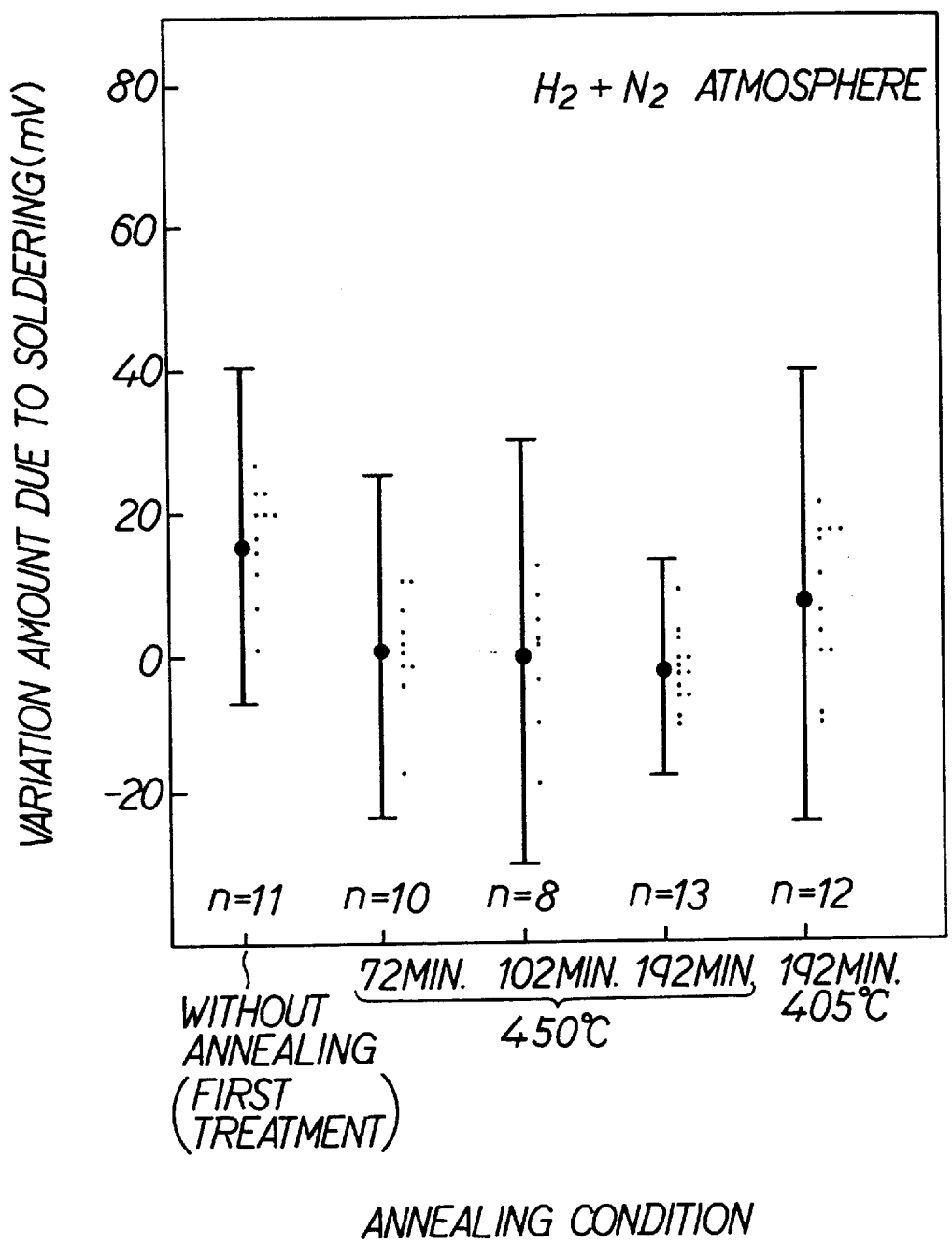
FIGS. 16 through 19 are characteristic diagrams illustrating variations in the output characteristics.
Figure 17:
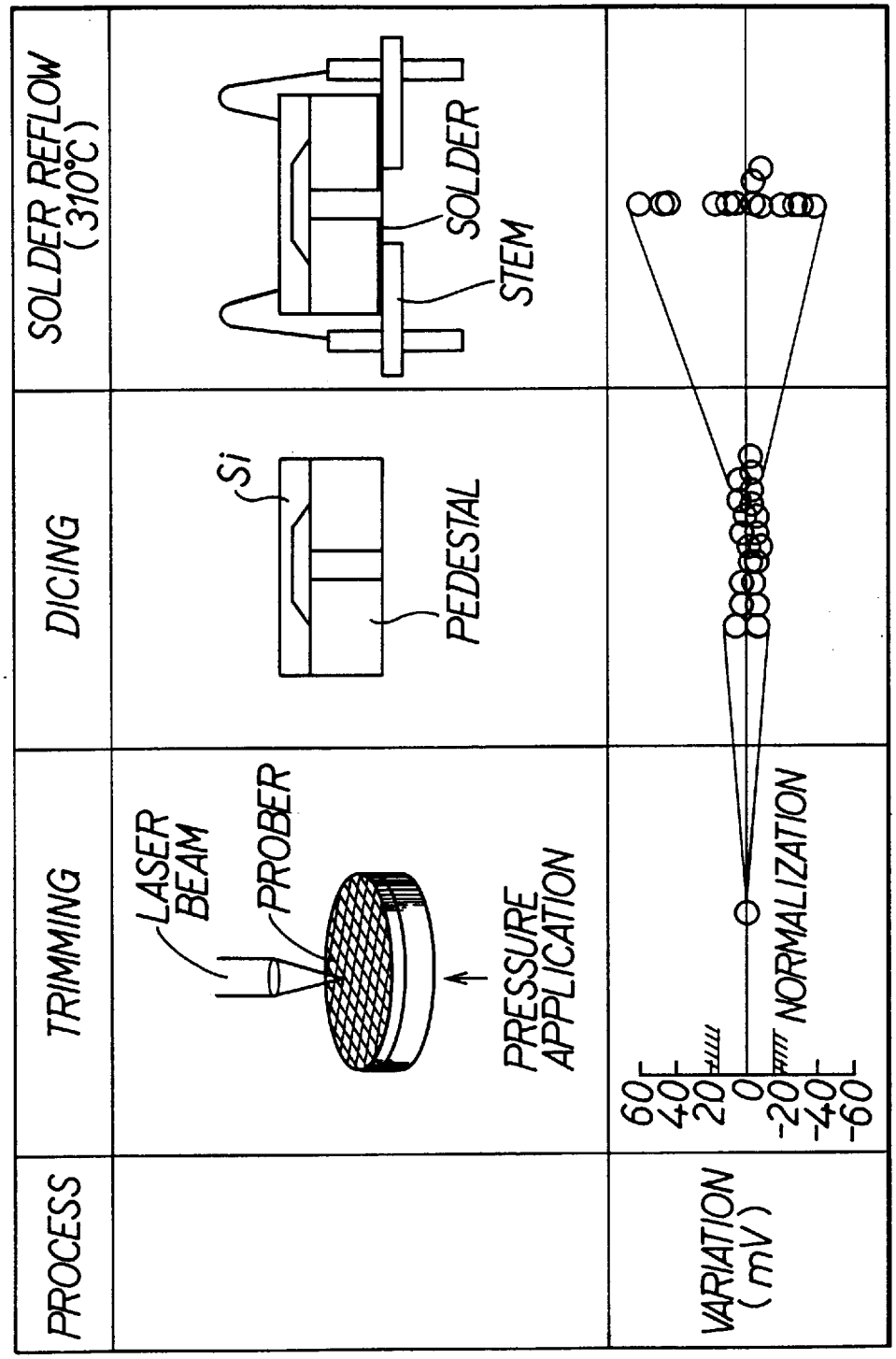

FIG. 16 illustrate s changes in the amounts of decrease in the variations in the output characteristics that occur when the annealing temperature and time length have respectively been varied using and 8 to 13 test products. It is understood that a large decrease in the variations in the output characteristics is realized by the annealing treatment performed at 450° C. and for 72 minutes or more. It is to be noted that in this test product the chip has an operational amplifier type amplification circuit built therein. Incidentally, in FIG. 17, there is illustrated a behavior of changes in the amounts of variations in the output characteristics that occur after a dicing step that succeeds the trimming and after assembling steps in the case where no annealing which is the first treatment is performed. It has been confirmed that according to this embodiment the variations in the output characteristics can be decreased down to one of several parts.

Although in the above-mentioned manufacturing process steps the pedestal plate 101 that was metallized before the anodic bonding step was used, an explanation will now be given of the metallization performed after the anodic bonding step. Namely, this is a case where, in the anodic bonding step, of the pedestal plate 101 that has no metallization film formed beforehand thereon is used and, after the anodic bonding step, an Au/Ni/Ti film is formed as a metallization film on the surface of the pedestal plate 101 soldered onto the stem 60.

The metallization step can be executed by electron beam vacuum evaporation under the conditions of 1 to $4 \times 10^{-6}$ Torr, Ti thickness of approximately 300 nm, Ni thickness of approximately 600 nm and Au thickness of approximately 150 nm. When forming the metallization layer by the use of such physical vapor deposition (PVD) technique, it results, for the above-mentioned reasons, in crystalline damages in the diaphragm, particularly the strain gauges 3 and the area in the vicinity thereof. If, in this case, even when the first treatment is performed in advance to the metallization step is executed after the performance of the first treatment, such damages remain to exist until the assembling step is executed and, in the thermal history (soldering) of the assembling step, are recovered. As a result, despite the adoption of the trimming step, the variations in the output characteristics occur. For this reason, in the case of executing the metallization step after the above-mentioned first treatment, it is needed to perform an annealing treatment (second treatment) at 350° C. for 27 minutes between the metallization step and the succeeding trimming step to thereby recover such damages before the execution of the trimming step.

Figure 18:
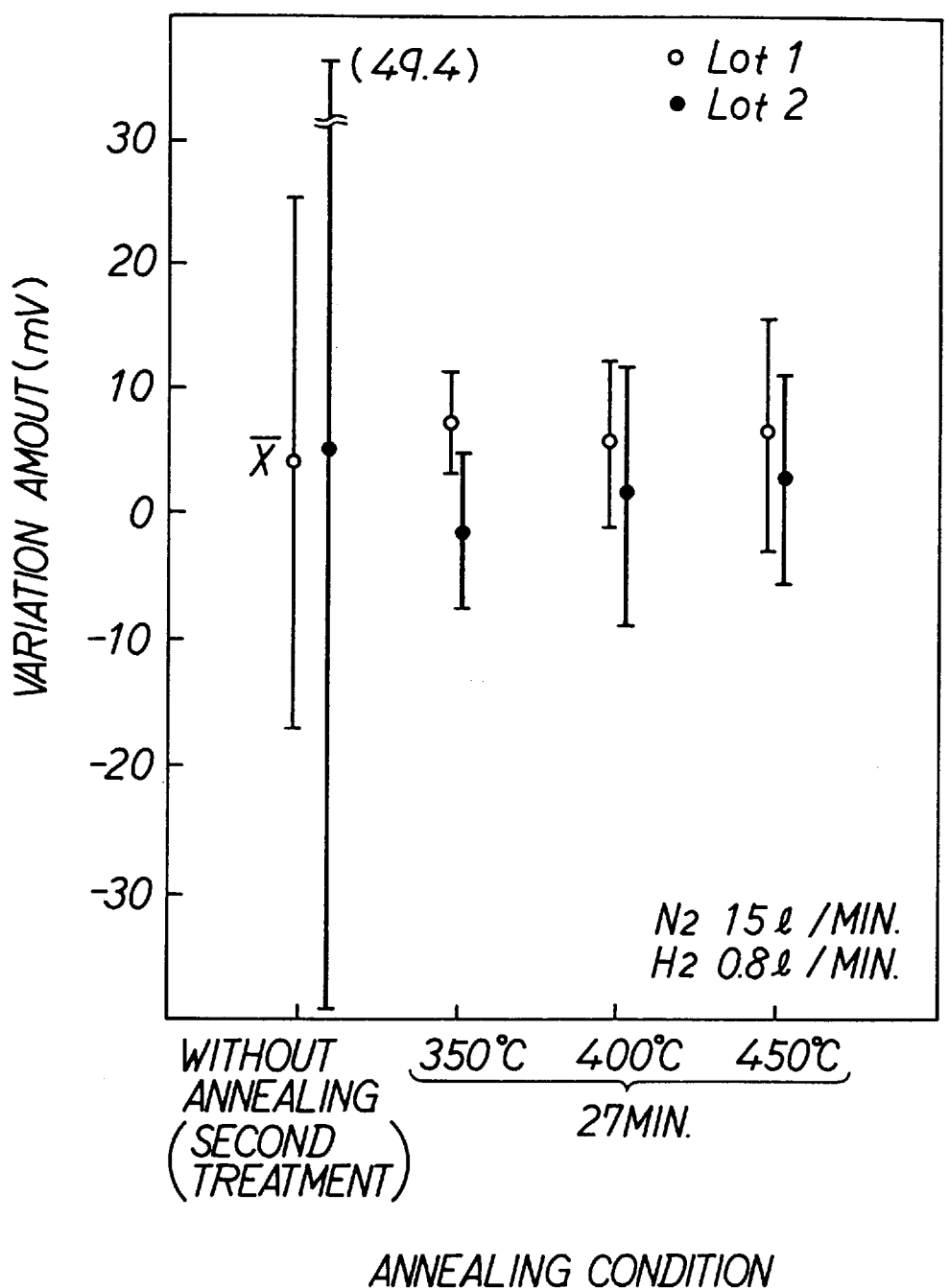

In order to exemplify the advantageous effect of performing the annealing treatment (second treatment) between the metallization step and the trimming step, using two lots of test products, one lot consisting of 15 chips, the amount of output fluctuation was investigated while the annealing temperature was being widely varied, provided, however, that the half-cutting step was omitted. The results are shown in FIG. 18. It has been made known from FIG. 18 that even when the metallization step is executed between the annealing step (first treatment) and the trimming step, the variations in the output characteristics caused thereby can be decreased through the execution of the annealing step (second treatment).

Figure 19:
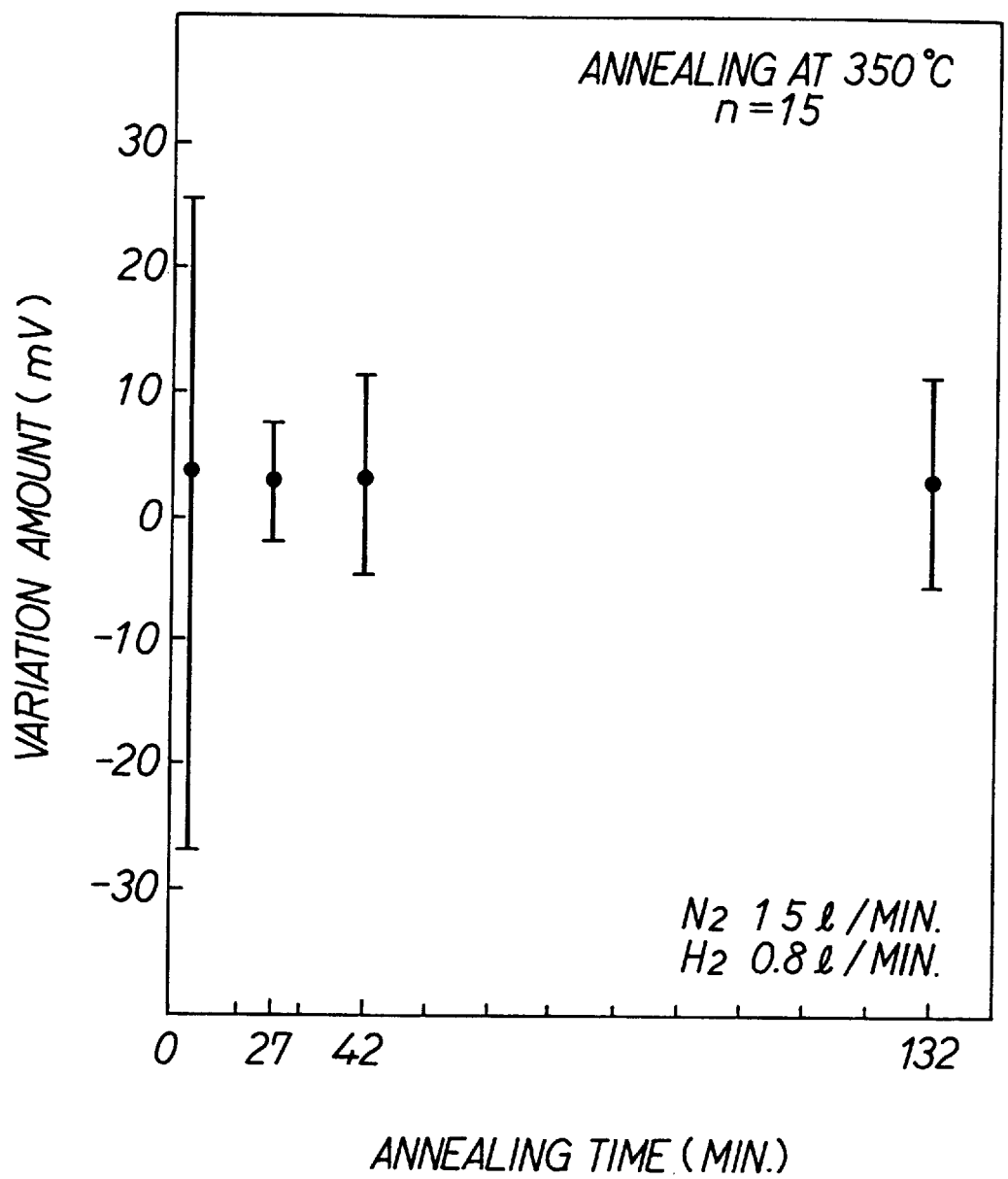

Also, using one lot of test products, one lot consisting of 15 chips, the amount of output fluctuations was investigated while the annealing time lengths were variously changed. The results obtained are shown in FIG. 19. It has been made known from FIG. 19 that even when the metallization step is executed between the annealing step as the first treatment and the trimming step, by executing the annealing step as the second treatment for 27 minutes or more the variations in the output characteristics can be decreased.

It is to be noted that as the causes of the occurrence of the output characteristic variations in the assembling step there can be listed the diaphragm portion forming step, anodic bonding step and metallization step which are executed between the annealing step usually executed after completion of the above-mentioned element forming process and the succeeding trimming step. Accordingly, if the annealing step is executed immediately after the execution of each of these steps, it is possible to expect more the effect of making it possible to prevent the occurrence of the characteristic fluctuations due to thermal history that is experienced after execution of the trimming step.

It is to be noted that in order to prevent the occurrence of the characteristic fluctuations due to thermal history that is experienced after the execution of the trimming step, it is sufficient to perform the first and second annealing treatments that are performed before the above-mentioned trimming, with a thermal load higher than the above-mentioned thermal history being applied to the wafer 100 and pedestal plate 101. If the soldering in the assembling step causes experience of a maximum thermal history, it is sufficient to perform the annealing treatment correspondingly at a temperature higher than that corresponding to the maximum thermal history, or soldering temperature. It is also to be noted that it is preferable that the upper limit of the annealing temperature be 660° C. or less at which the wiring (aluminum) is not melted.

It is to be noted that the amount of output fluctuation represented in each of FIGS. 16 through 19 is a value which has been obtained by subtracting the DC offset voltage after the trimming step from the DC offset voltage after the assembling step (soldering).

Incidentally, although in the above-mentioned embodiment reference has been made using the semiconductor pressure sensor as an example, the present invention can of course be applied also to a semiconductor acceleration sensor, for example.

While the present invention has been shown and described with reference to the foregoing preferred embodiments, it will be apparent to those skilled in the art that changes in form and detail may be made therein without departing from the scope of the invention as defined in the appended claims.

What is claimed is:

1. A semiconductor sensor comprising:
   a semiconductor chip having:
   a signal conversion portion which converts a physical quantity to an electric signal, said signal conversion portion outputting a pair of signal voltages, a difference between said pair of signal voltages varies in response to said physical quantity;
   a pair of signal amplification portions for amplifying said pair of signal voltages individually; and
   a subtraction portion for outputting a difference voltage between amplified signal voltages outputted from said pair of signal amplification portions, wherein said pair of signal amplification portions are disposed in symmetrical positions on the semiconductor chip.

2. A semiconductor sensor according to claim 1, further comprising a supporting member bonded to the semiconductor chip.

3. A semiconductor sensor according to claim 1, wherein said pair of signal amplification portions are disposed in line-symmetrical positions about a reference line on the semiconductor chip.

4. A semiconductor sensor according to claim 3, wherein the reference line connects a center of the semiconductor chip and a center of a side of the semiconductor chip.

5. A semiconductor sensor according to claim 3, wherein the reference line connects a center of the semiconductor chip and an apex of the semiconductor chip.

6. A semiconductor sensor according to claim 3, wherein each of the line-symmetrical positions is disposed in a range of ½ or less of a distance between the reference line and a corresponding side of the semiconductor chip.

7. A semiconductor sensor according to claim 4, wherein each of the line-symmetrical positions is disposed in a range of ½ or less of a distance between the reference line and a corresponding side of the semiconductor chip.

8. A semiconductor sensor according to claim 1, wherein said pair of signal amplification portions are disposed in point-symmetrical positions about a center of the semiconductor chip.

9. A semiconductor sensor according to claim 1, wherein the signal conversion portion comprises a bridge circuit that includes a strain gauge disposed on a thin thickness region of the semiconductor chip.

10. A semiconductor sensor according to claim 1, wherein initial state amplification circuits of said pair of signal amplification portions are disposed in symmetrical positions.

11. A semiconductor sensor according to claim 10, wherein, when a distance between a center of gravity of a first circuit element disposed within one of the initial stage amplification circuits and a first side of the semiconductor ship is represented by d1' and a distance between a center gravity of a second circuit element disposed within the other of the initial stage amplification circuits and a second side of the semiconductor chip that is a side symmetrical with the first side is represented by d2', a difference $\Delta d=(d1'-d2')$ between the both distances d1' and d2' and d2' is set to be less than 15% of a mean dm=(d1'+d2')/2 of both distances d1' and d2'.

12. A semiconductor sensor according to claim 10, wherein every one of the circuit elements comprising each of the initial stage amplification circuits are disposed in symmetrical positions.

13. A semiconductor sensor comprising:

a semiconductor chip having:

a signal conversion portion which converts a physical quantity to an electric signal, said signal conversion portion outputting a pair of signal voltages, a difference between said pair of voltages varies in response to said physical quantity;

a pair of signal amplification portions for amplifying said pair of signal voltages individually; and a subtraction portion for outputting a difference voltage between amplified signal voltages outputted from said pair of signal amplification portions; and a pedestal bonded to the semiconductor chip, wherein said pair of signal amplification portions are disposed on an isostress line on which residual stress caused by bonding the semiconductor chip to the pedestal is substantially equal.

\* \* \* \* \*

UNITED STATES PATENT AND TRADEMARK OFFICE
CERTIFICATE OF CORRECTION

PATENT NO. : 5,770,883
DATED : June 23, 1998
INVENTOR(S) : MIZUNO et al.

It is certified that error appears in the above-identified patent and that said Letters Patent is hereby corrected as shown below:

On the title page, item [75] :
Please delete "    inventor "Kenichi Yokoyama".

Signed and Sealed this

First Day of June, 1999

Attest:

Q. TODD DICKINSON

Attesting Officer

Acting Commissioner of Patents and Trademarks